United States Patent
Chen et al.

(10) Patent No.: US 12,048,247 B1
(45) Date of Patent: Jul. 23, 2024

(54) EXTREME ENVIRONMENT CAPABLE MULTILAMINAR TRANSDUCTIVE BIOMORPH DEVICE

(71) Applicants: QorTek, Inc., Linden, PA (US); Clive A. Randall, State College, PA (US)

(72) Inventors: Wei-Ting Chen, State College, PA (US); Safakcan Tuncdemir, Lemont, PA (US); Ahmet E. Gurdal, State College, PA (US); Gareth J. Knowles, Williamsport, PA (US); Clive A. Randall, State College, PA (US)

(73) Assignee: QorTek, Inc., Linden, PA (US)

( * ) Notice: Subject to any disclaimer, the term of this patent is extended or adjusted under 35 U.S.C. 154(b) by 561 days.

(21) Appl. No.: 17/146,340

(22) Filed: Jan. 11, 2021

Related U.S. Application Data

(60) Provisional application No. 62/958,783, filed on Jan. 9, 2020.

(51) Int. Cl.
| | | |
|---|---|---|
| *H10N 30/00* | (2023.01) | |
| *H10N 30/057* | (2023.01) | |
| *H10N 30/50* | (2023.01) | |
| *H10N 30/853* | (2023.01) | |
| *H10N 30/87* | (2023.01) | |

(52) U.S. Cl.
CPC ....... *H10N 30/1071* (2023.02); *H10N 30/057* (2023.02); *H10N 30/50* (2023.02); *H10N 30/853* (2023.02); *H10N 30/8536* (2023.02); *H10N 30/8542* (2023.02);
(Continued)

(58) Field of Classification Search
CPC .......... H10N 30/1071; H10N 30/8542; H10N 30/8561; H10N 30/50; H10N 30/057; H10N 30/874; H10N 30/877; H10N 30/8536; H10N 30/8554; H10N 30/853
See application file for complete search history.

(56) References Cited

U.S. PATENT DOCUMENTS

| | | |
|---|---|---|
| 3,710,151 A | 1/1973 | Massa et al. |
| 5,632,841 A | 5/1997 | Hellbaum et al. |
| (Continued) | | |

FOREIGN PATENT DOCUMENTS

| | | |
|---|---|---|
| CN | 112151667 A | * 12/2020 |
| JP | H0646663 B2 | * 12/2016 |

OTHER PUBLICATIONS

Gary Hunter et al., "Development and application of high temperature sensors and electronics for propulsion applications", Proceedings of SPIE, Defense and Security Symposium, May 10, 2006, pp. 1-13.
(Continued)

*Primary Examiner* — J. San Martin
(74) *Attorney, Agent, or Firm* — CAHN & SAMUELS, LLP

(57) ABSTRACT

A wire-free multilayer biomorph device is provided where the layers are bonded without use of adhesive. The device includes a plurality of stacked perforated metal plates with interposed transductive assembly layers. The perforated metal plates and transductive assembly layers are bonded by a conductive metal ink that is subject to a thermal cycle process. Electrical connection of the perforated metal plates and transductive assembly are realized through structural connectors thru-connectors thereby obviating the need for wiring.

5 Claims, 7 Drawing Sheets

(52) U.S. Cl.
CPC ..... *H10N 30/8554* (2023.02); *H10N 30/8561* (2023.02); *H10N 30/874* (2023.02); *H10N 30/877* (2023.02)

(56) References Cited

U.S. PATENT DOCUMENTS

| | | |
|---|---|---|
| 6,512,323 B2 | 1/2003 | Forck et al. |
| 6,665,917 B2 | 12/2003 | Knowles et al. |
| 2008/0211353 A1 | 9/2008 | Seeley et al. |

OTHER PUBLICATIONS

Haocheng Zhoe et al., "A High-Temperature Optical Sapphire Pressure Sensor for Harsh Environments", AIAA SciTech Forum, Jan. 2019, pp. 1-12, American Institute of Aeronautics and Astronautics.

Yoonho Seo et al. "High-Temperature Piezoelectric Pressure Sensors for Hypersonic Flow Measurements", Nov. 7, 2023, pp. 1-4.

R. C. Turner et al., "Materials for High Temperature Acoustic and Vibration Sensors: A Review" Applied Acoustics, 1994, pp. 1-26.

R. Wayne Johnson et al., "The Changing Automotive Environment: High-Temperature Electronics" IEEE Transactions on Electronics Packaging Manufacturing, Jul. 2004, pp. 1-13, vol. 27, No. 3.

Christopher Bosyj et al., "Brazing Strategies for High Temperature Ultrasonic Transducers Based on LiNbO3 Piezoelectric Elements" Instruments 2019, pp. 1-12, Dec. 23, 2018, MDPI.

David Parks et al. "High-Temperature (>500° C.) Ultrasonic Transducers: An Experimental Comparison Among Three Candidate Piezoelectric Materials" IEEE Transactions on Ultrasonics, Ferroelectrics, and Frequency Control, May 2013, pp. 1-6, vol. 60, No. 5.

Justine Billore et al., "Sintered-Silver Bonding of High-Temperature Piezoelectric Ceramic Sensors" IEEE Transactions on Components, Packaging, and Manufacturing Technology, Jan. 2017, pp. 1-7, vol. 7, No. 1.

Shujun Zhang et al., "Characterization of high temperature piezoelectric crystals with an ordered langasite structure" Journal of Applied Physics, Jun. 10, 2009, pp. 1-7.

R. A. Moore et al., "Total Dose Effect on Ferroelectric PZT Capacitors used as Non-Volatile Storage Elements" IEEE Transactions on Nuclear Science, Dec. 1993, pp. 1-6, vol. 40, No. 6.

Mary Anderson et al., Investigating Effect of Space Radiation Environment on Piezoelectric Sensors: Cobalt-60 Irradiation Experiment, Journal of Nondestructive Evaluation, Diagnostics and Prognostics of Engineering Systems, Feb. 2018, pp. 1-11, vol. 1.

\* cited by examiner

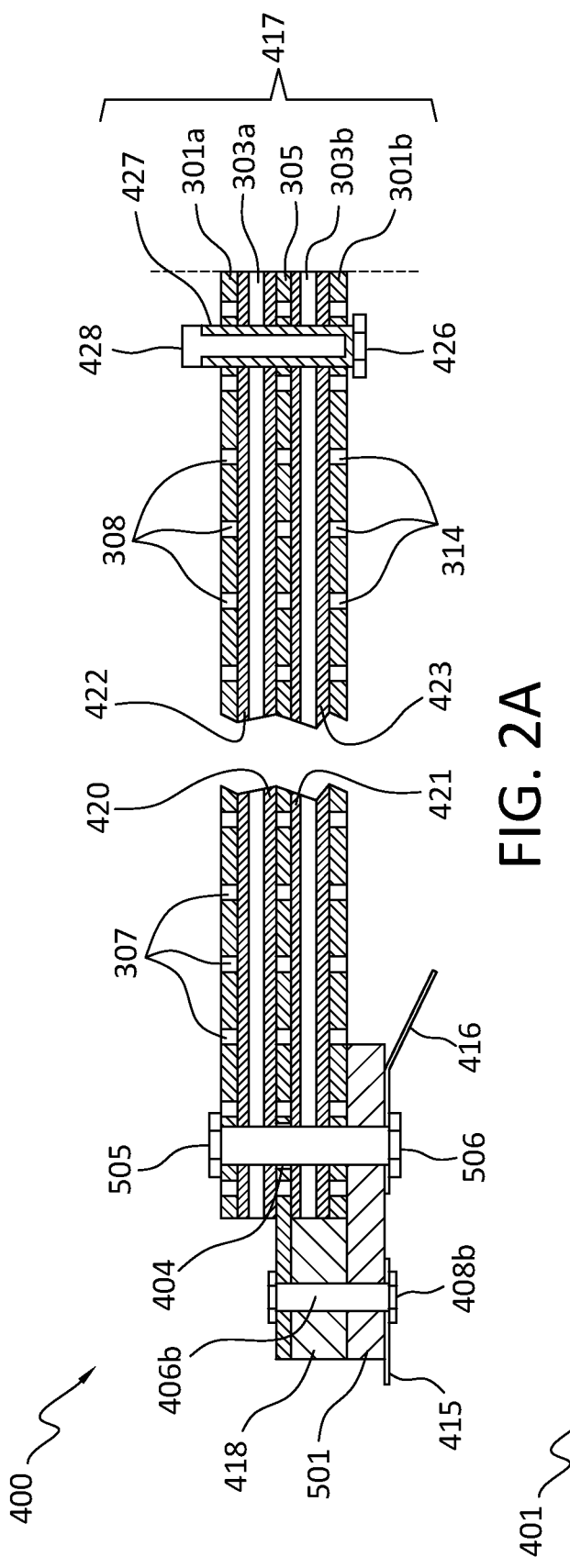
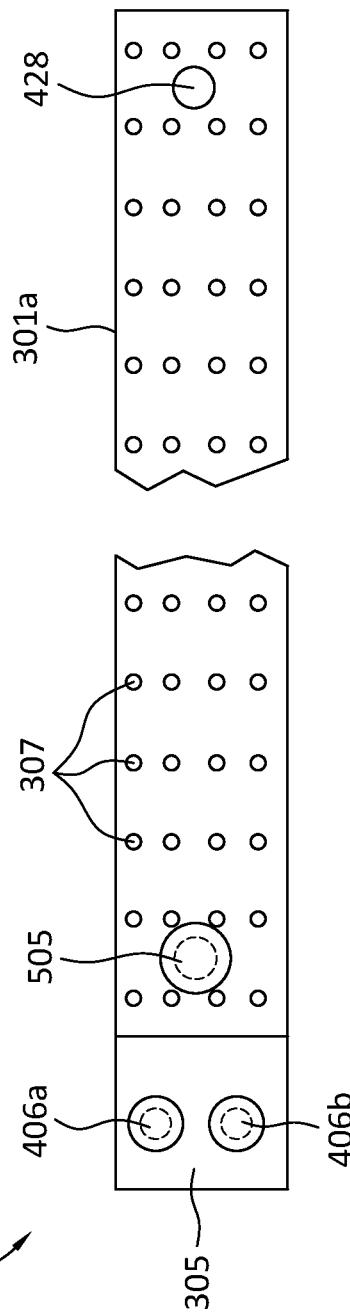
FIG. 2A
FIG. 2B

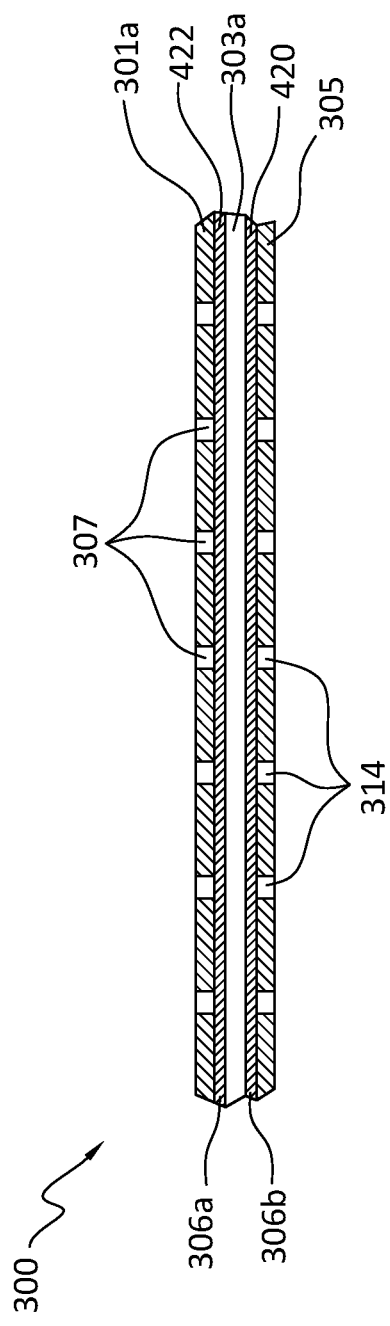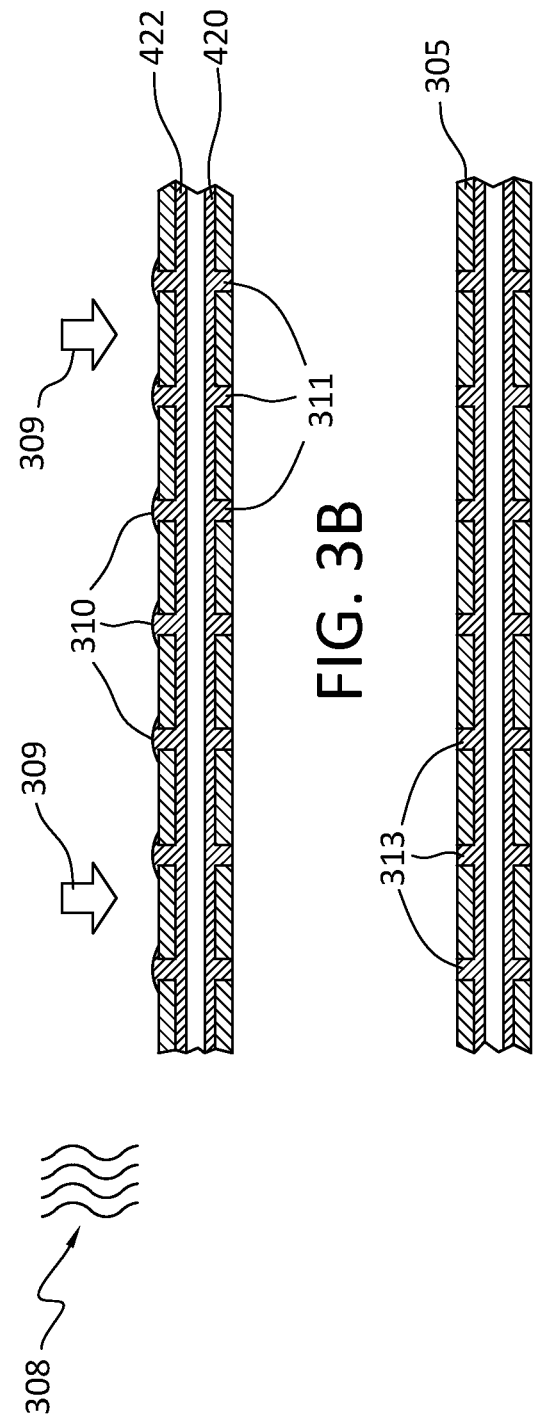

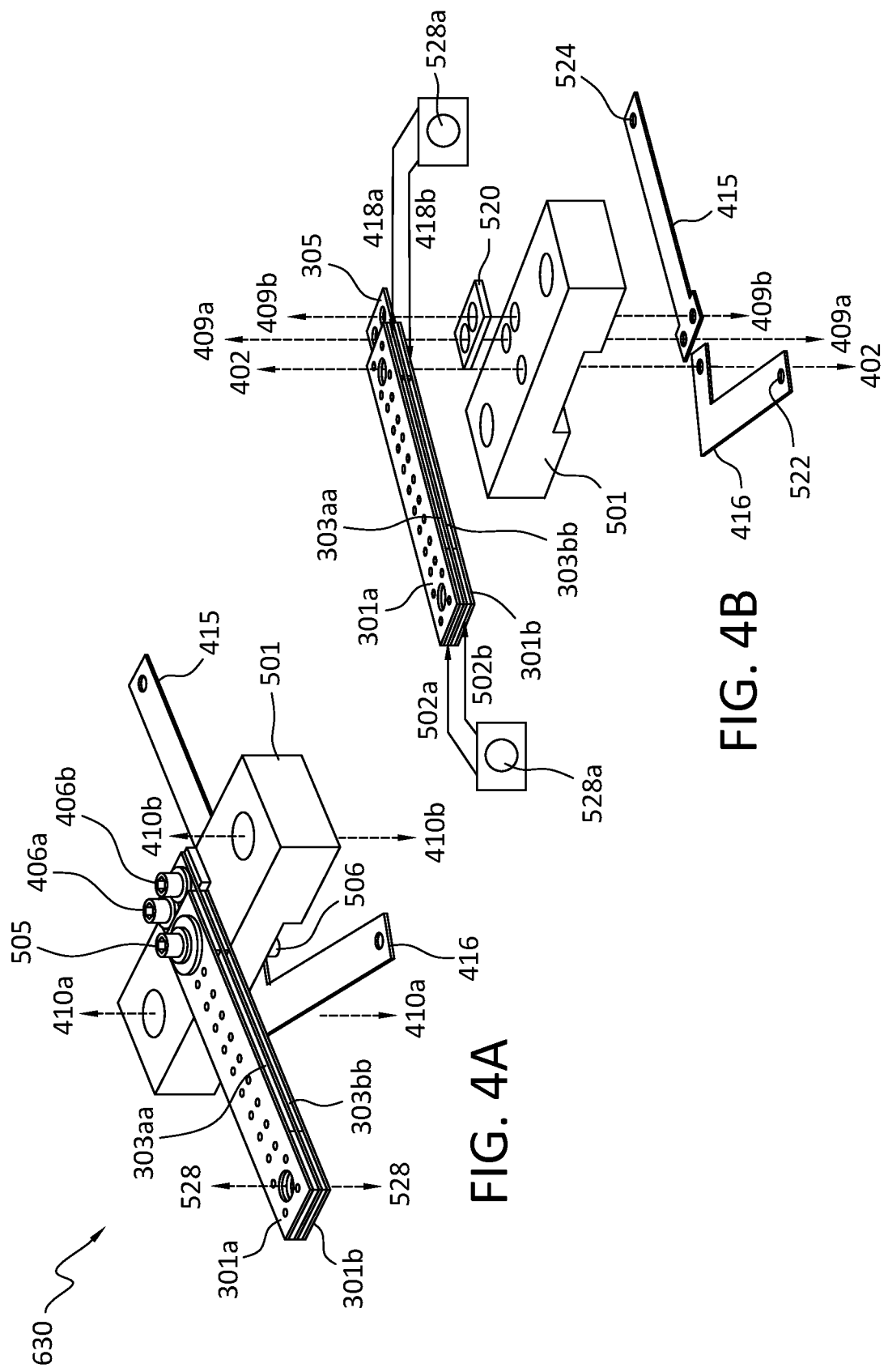

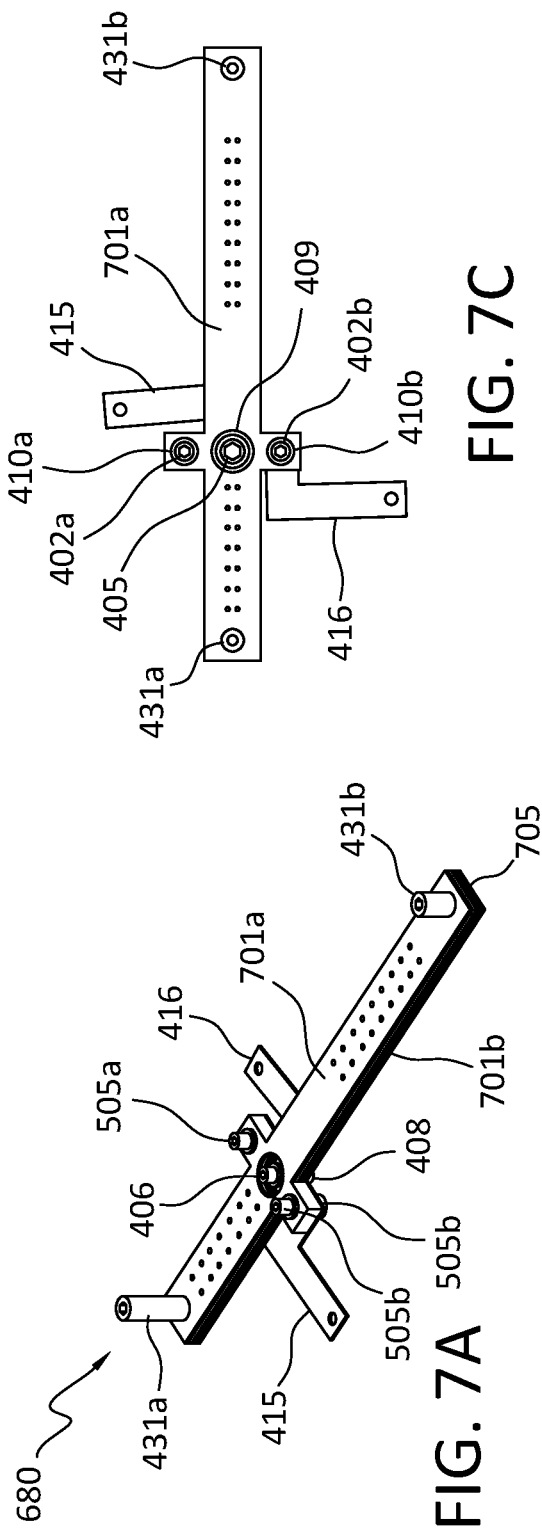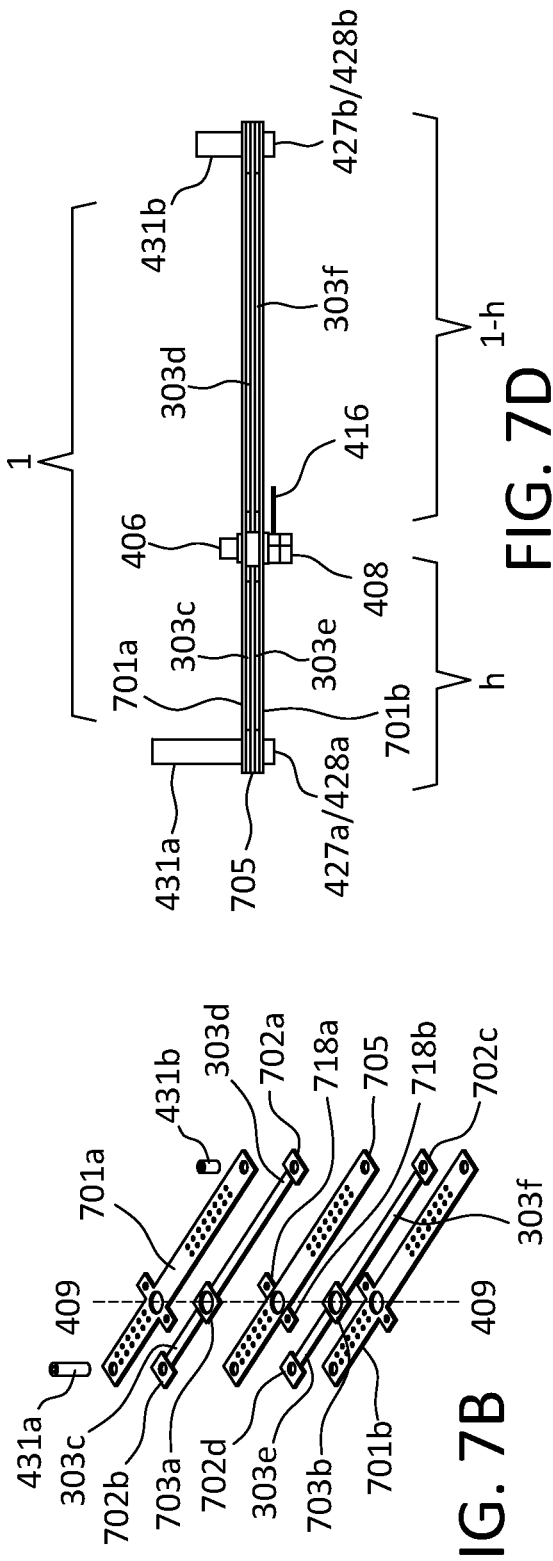

EXTREME ENVIRONMENT CAPABLE MULTILAMINAR TRANSDUCTIVE BIOMORPH DEVICE

This application claims the benefit of U.S. Provisional Patent Application Ser. No. 62/958,783 filed on Jan. 9, 2020, which is incorporated by reference herein in its entirety.

STATEMENT REGARDING FEDERALLY SPONSORED RESEARCH OR DEVELOPMENT

This invention was made with government support under US Government Small Business Technology Transfer (STTR) Contract: NASA NNX16CS16C awarded by The National Aeronautics and Space Administration. The government has certain rights in the invention.

BACKGROUND OF THE INVENTION

The present invention relates to transductive-based sensors, actuators and energy harvesters that can meet the needs of actuation, sensing, and energy harvesting in extreme thermal conditions. Depending upon the need, embodiments of the present invention can be implemented in differing geometries that offer varying frequency band, force-displacement characteristics, and fixturing options.

Actuation, sensing, and energy harvesting technologies for use at high-temperature regimes, for example >350° C. for aerospace launch propulsion systems and satellite thrusters, are in great demand. More recently for space exploration technology, specifically high-temperature planetary missions and orbital commercial space vehicles and hypersonic high-speed reentry and hypersonic flight systems as to include instrumentation for flight testing of future hypersonic platforms. Indeed, this need for high temperature devices stretches across automotive, aerospace, space, defense, and energy industries. As an example, high temperature sensors and energy harvesters are needed for testbeds, and operational system maintenance and safety for heavy space propulsion systems for temperatures in the range of 250-500° C., and with lifetimes up to 100,000 h.

In automotive combustion systems, high-temperature sensors are essential for recording engine temperature, pressure, and vibration to improve the efficiency and reliability of internal combustion engines. Among various sensing applications, combustion sensors or knock sensors are subject to the harshest environments because these sensors need to be located as close as possible to the high-temperature source (e.g., the combustion engine) for accurate monitoring. Ultrasonic transducers in high temperature environments allows for continuous monitoring of critical components and processes without the need to halt industrial operations.

In summary, high temperature sensors, energy harvesters, and actuators are a critical need in a broad range of defense, space, and industrial sectors, as well as emerging areas such as deep planetary exploration and hypersonic flight and weapon systems.

Piezoelectric based actuators can offer several advantages relative to technologies such as solenoids and mechanical mechanisms due to their higher bandwidth and higher force per unit volume than any other known option. Similarly, piezoelectric based sensors and energy harvesters can offer some key advantages over other technologies based on optics and magnetics, such as solar or magnetics due to their low mass/low volume, simplicity, and low cost. This is exampled by medical applications where nearly all modern portable imagers rely solely on piezoceramics. Similarly exampled by underwater detection and communication that rely solely on piezoceramics.

Although there has been significant interest in development of high temperature capable piezoelectric materials, there has been remarkably little on piezoelectric actuators, sensors, and harvesters that can operate over broad temperature variations to high ambient temperature regimes and little consideration of vibrational energy harvesting at elevated temperatures. Indeed, there is a near complete lack ruggedized sensors and system components that can operate under the harsh environmental conditions. The exception being some efforts to develop high temperature capable ultrasonic devices that employ single crystal elements, and very limited prior art of high temperature capable piezoelectric devices of cantilevers or disc geometries, notably.

III. SUMMARY OF INVENTION DISCLOSED

The invention provides a new class of actuators, sensors and energy harvesters comprised entirely and, in some embodiments, exclusively of metal and transductive material; such transductive materials exampled by ceramic piezoelectric or electrostrictive materials. Devices of the present invention enable electrical connectivity with complete absence of wiring and non-adhesive mating of the layers in the construction. Due to the elimination of all wiring and adhesives, an advantage of the invention is that many of its embodiments are now extraordinarily rugged to harsh environments such as extremely high ambient temperatures and very high ambient radiation. Some embodiments of the invention are capable of operating at over 1000° C. and at over 5 Mrad. The ultra-rugged construction results in a new class of devices that not only can operate in extreme environments, but that can withstand repeated extreme shock events without failure. Another advantage of the invention is that certain ceramic piezoelectric embodiments of the inventions now solve the long-standing issue of thermal degradation of all high temperature piezoelectric devices of the prior art. That is, certain embodiments of the present invention of exhibit near constant performance over a wide thermal range to several hundred degrees Celsius, more particularly from −40° C. to up to 500° C. and in some embodiments from 20° C. to 350° C. That is, the stress-strain-voltage data of these embodiments of the invention exhibit nearly identical response at many hundreds of degrees Celsius ambient as to corresponding data taken at ambient room temperature.

Embodiments of the invention can function as extreme environment capable energy harvesters; sensors such as strain, pressure, or accelerometer; or as actuation mechanisms, simply by selection of transductive materials of which they are comprised and their external mechanical and electrical connections. This is exemplified by attaching a device of the invention to an external AC power source, in which case the device can act in an actuator mode, whereas attaching the identical device to a mechanical excitation allows the device to act as an energy harvester. Some embodiments of the present invention incorporate a self-integrated tip-mass arrangement. In those embodiments, the transductive material and self-integrated tip mass may be selected so as to optimize the purpose and performance of the embodiments of the invention.

Further embodiments of the present invention represent extreme environment capable devices that can operate over a wide spectrum. That is, the embodiments can sense or harvest energy over a wide spectral range as to be far more effective than piezoelectric-based or magnetostrictive-based energy harvesting devices of the prior art The invention offers the first piezoceramic class of sensors, actuators, and energy harvesters that can effectively function at high temperatures experienced by such as hypervelocity vehicles and launch propulsion systems. This ability is obtained through introduction of the following novel principles:

The survivability at high temperature of the wiring to the electroding of a single laminate piezoelectric device or a multilayer laminate piezoelectric device that employs interdigitated electroding can be a daunting challenge. The invention eliminates this survivability issue by eliminating the need for wiring. The devices of the invention instead employ an arrangement whereby two, or two sets of, fixturing devices, such as through screws or set screws act as the means to directly enable independent positive and negative conduction to the electrode layers without any need to introduce a wiring arrangement.

In some embodiments the present invention incorporates high power piezoelectric materials that can now be incorporated into the laminar construction in a manner that maintains stable power performance across the entire thermal band from below room temperature to up to about 350° C. and can maintain acceptable performance up to about 500° C.

The invention introduces a non-adhesive mating method for the multilaminar biomorph device compatible for laminate piezoelectric mechanisms that is compatible with usage of said mechanisms at high to very high ambient temperatures without failure or loss in performance. This mating method, sometimes referred to as "fire bonding at elevated pressure technique" entails first selecting low coefficient of thermal expansion (CTE) laminate materials as to assure the bonding method results in an undamaged intimate conductive layer bonding between the piezoelectric layers and the metallic layers that comprise the invention. The non-adhesive mating method for the layers introduced further induces a desirable compressive pre-stress in the piezoelectric layers directionally in parallel with the metal layers as to increase the overall device performance. Note that minimal shrinkage of the bonding material and the laminate layers being a desirable trait due to the cooling segment of the temperature+pressure bonding cycle introduced.

Some embodiments of the present invention employ perforated metal plates to maximize the stiffness while aiding non-adhesive mating.

In some embodiments invention that consist of one or more of multilaminate interposed layer arrangements forming a piezoelectric bimorph cantilever beam geometry or a disc geometry where all layers are simultaneously bonded by employing the fire bonding at elevated pressure technique.

In some embodiments, the invention includes a rotor blade arrangement comprising blades of varying lengths that share a common hub fixture point (mechanical ground). The blade arrangement may be comprised of laminated piezoelectric multilayer bimorph beams with an arrangement to affix a selectable tip mass installed at each of two free ends which results in a wider band and higher power sensing or energy harvesting capabilities than prior art known to the inventors. This embodiment moreover exhibits stable high-power performance from below room temperature to above 350° C. ambient conditions.

VI BRIEF DESCRIPTION OF THE DRAWINGS

The present invention is described with reference to the accompanying drawings. In the drawings, like reference numbers indicate identical or functionally similar elements. The use of cross-hatching and shading within the drawings is not intended as limiting the type of materials that may be used to manufacture the invention.

FIG. 2A depicts a sectional side view of a laminate layer assembly according to another embodiment of the invention.

FIG. 2B illustrates a top view of the laminate layer assembly of FIG. 2A.

FIG. 3A shows a sectional side view of a laminate layer assembly including a conductive metal layer according to an embodiment of the invention.

FIG. 3B illustrates the laminate layer of FIG. 3A after application of a thermal profile.

FIG. 3C depicts the laminate layer of FIG. 3B with access material removed.

FIG. 4A shows a perspective view of a laminate layer assembly with mechanical and electrical connectors in accordance with an embodiment of the invention.

FIG. 4B illustrates an exploded view of the laminate layer assembly of FIG. 4A.

FIG. 7A is a perspective view a wideband spectrum capable cantilever multilaminate device in accordance with the present invention.

FIG. 7B is an exploded view of the device of FIG. 7A.

FIG. 7C is a top view of the device of FIG. 7A.

FIG. 7D is a side view of the device of FIG. 7D.

VII DESCRIPTION OF THE EMBODIMENTS

Figure 1A:
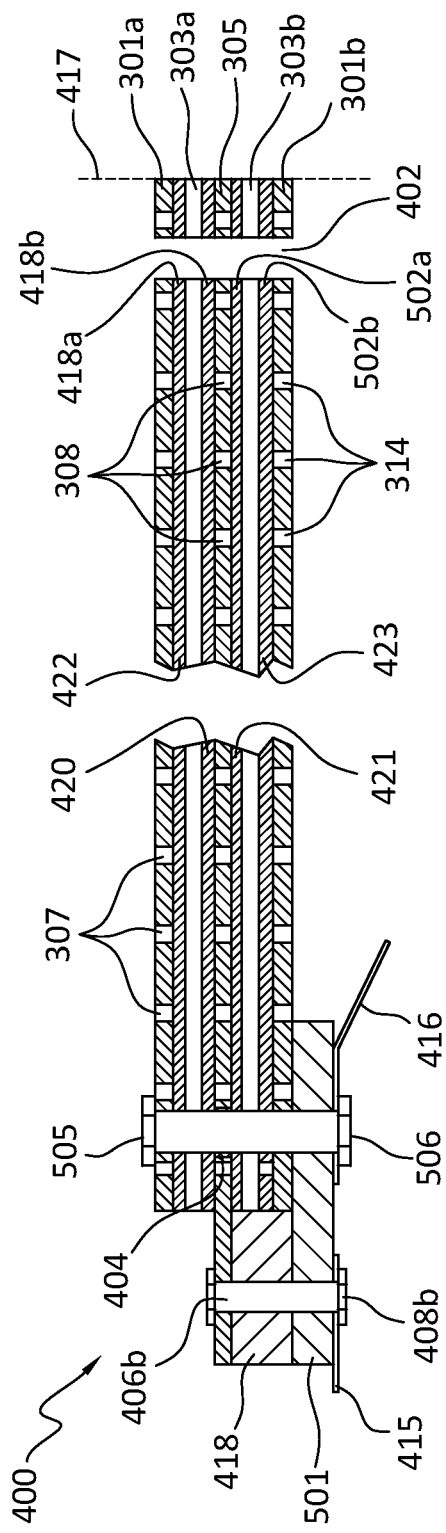
FIG. 1A depicts a sectional side view of a laminate layer assembly according to an embodiment of the invention.

The description of the invention is provided by the incorporated figures, none of which are to scale, but are instead intended to explicate the key features in the design and construction of the invention. In reference to FIGS. 1A and 1B, a multilaminar arrangement 400 is shown including a first transductive assembly layer 303a positioned between a perforated top metal plate 301a and a perforated center metal plate 305. Similarly, a second transductive assembly layer 303b is positioned between a perforated bottom metal plate 301b and a perforated center plate 305. A a thin conductive metal layer 423 disposed between transductive assembly layer 303b and perforated bottom metal plate 301b and a similar conductive metal layer 421 is disposed between transductive assembly layer 303b and perforated center plate 305. In keeping with the invention, to facilitate both for construction and function, in some embodiments, perforated top metal plate 301a and perforated bottom metal plate 301b are similarly planar sized. In some embodiments, transductive assembly layers 303a and 303b are also similarly planar sized, but are of equal or smaller planar size than the planar size of top and bottom perforated metal plates 301a and 301b. In some embodiments, transductive assembly layers 303a and 303b and top and bottom perforated metal plates 301a and 301b have the same planar width but not necessarily the same thickness. Perforated center metal plate 305 is of greater length along its main axis than either perforated top and bottom metal plates 301a and 301b and transductive layers 303a and 303b. Thus, when perforated top, center and bottom metal plates 301a, 305 and 301b and transductive assembly layers 303a and 303b are commonly aligned at one end (referred to herein as the common alignment end 417 of device 400), center metal plate 305 will protrude a certain length "d" beyond the similar conductive opposing ends of transductive assembly layers 303a and 303b and top and bottom metal plates 301a and 301b (referred to herein as the protrusion end 419 of device 400).

Referring to FIGS. 4A and 4B, in some embodiments, transductive assembly layers 303a and 303b include thin non-conductive spacers 418a, 418b, 502a, and 502b disposed at respective end portions of transductive members 303aa and 303bb and positioned between perforated center plate 305 and the ends of top and bottom perforated plates 301a and 301b. As shown in FIG. 4A, in some embodiments a first tip mass acceptor channel 528 is configured for optional tip mass insertion and is formed by aligned cut outs through perforated top metal plate 301a, spacer 502a, perforated center plate 305, spacer 502b, and perforated bottom metal plate 301b. FIG. 4B shows cut outs 528a formed in spacers 502a and 502b that are vertically aligned with tip mass cut outs formed at a first end portion of perforated top metal plate 301a, perforated center plate 305 and perforated bottom metal plate 301b to form tip mass acceptor channel 528.

Referring to FIGS. 8A and 8B, to facilitate electrical connection, a structural connector 501 is provided. In some embodiments, structural connector 501 may take the form of a block of stiff, non-conductive material incorporating several matching cut-outs 402 and 409. In keeping with the invention, block 501 may be mated with device 400 such that cut outs 402 and 409 are aligned through perforated top and bottom metal plates 301a, 301b, transductive assembly layers 303a, 303b, and block 501. In some embodiments where transductive assembly layers 303a and 303b include spacers 418a and 418b. In such embodiments, spacers 418a and 418b are provided with cut outs 402.

A positive polarity metal tab 416 is provided with cut out 402 and is mated with block 501 such that cut out 402 aligns with cut out 402 of block 501. Positive polarity tab 416 also incorporates a connection point 522 configured to accept an external positive polarity lead, or other, connector. A negative polarity metal tab 415 is provided with cut out 409 and is mated with block 501 such that cut out 409 aligns with cut 409 of block 501. Negative polarity tab 415 also incorporates a connection point 524 configured to accept an external negative polarity lead, or other, connector. In some embodiments block 501 may incorporate recessed regions in its base as to enable flush mounting of tabs 415 and 416.

In keeping with an aspect of the invention, a non-conductive spacer 520 may be disposed in a vertical gap between the protrusion of 305 and a top surface of block 501. Spacer 520 incorporates cut-outs 409 which are aligned with cut-outs 409 of perforated central plat 305, block 501, and negative polarity tab 415.

Referring again to FIG. 1, a thin conductive metal layer 422 is disposed between 301a and transductive assembly layer 303a excepting planar region corresponding to spacers 418a and 502a. Similarly, a thin conductive metal layer 420 is disposed between perforated center plate 305 and transductive assembly layer 303a excepting planar region corresponding to spacers 418a and 502a. A thin conductive metal layer 423 is disposed between perforated center plate 305 and transductive assembly layer 303b excepting planar region corresponding to spacers 418b and 502b. Similarly, a thin conductive metal layer 421 is disposed between perforated center plate 305 and transductive assembly layer 303b excepting planar region corresponding to spacers 418a and 502a.

Referring to FIGS. 2A and 2B, with the laminates carefully aligned to form a common planar piece with common end 417, one or more common positive polarity electrical connectors 505, such as a thru-bolt or screw arrangement, may be installed through each vertically aligned cut-out 402 to electrically connect perforated top metal plate 301a, perforated bottom metal plate 301b, and positive polarity electrical tab 416. In keeping with an aspect of the invention, connectors 505 connectors are not electrically connected to perforated center plate 305. Importantly, connector 505 plays a dual role of both electrically connecting the outward facing side of both transductive layer 303a and transductive layer 303b to positive electrical tab 416 while simultaneously mechanically affixing all the layers of device 400, block. 501, and tab 416.

Figure 6:
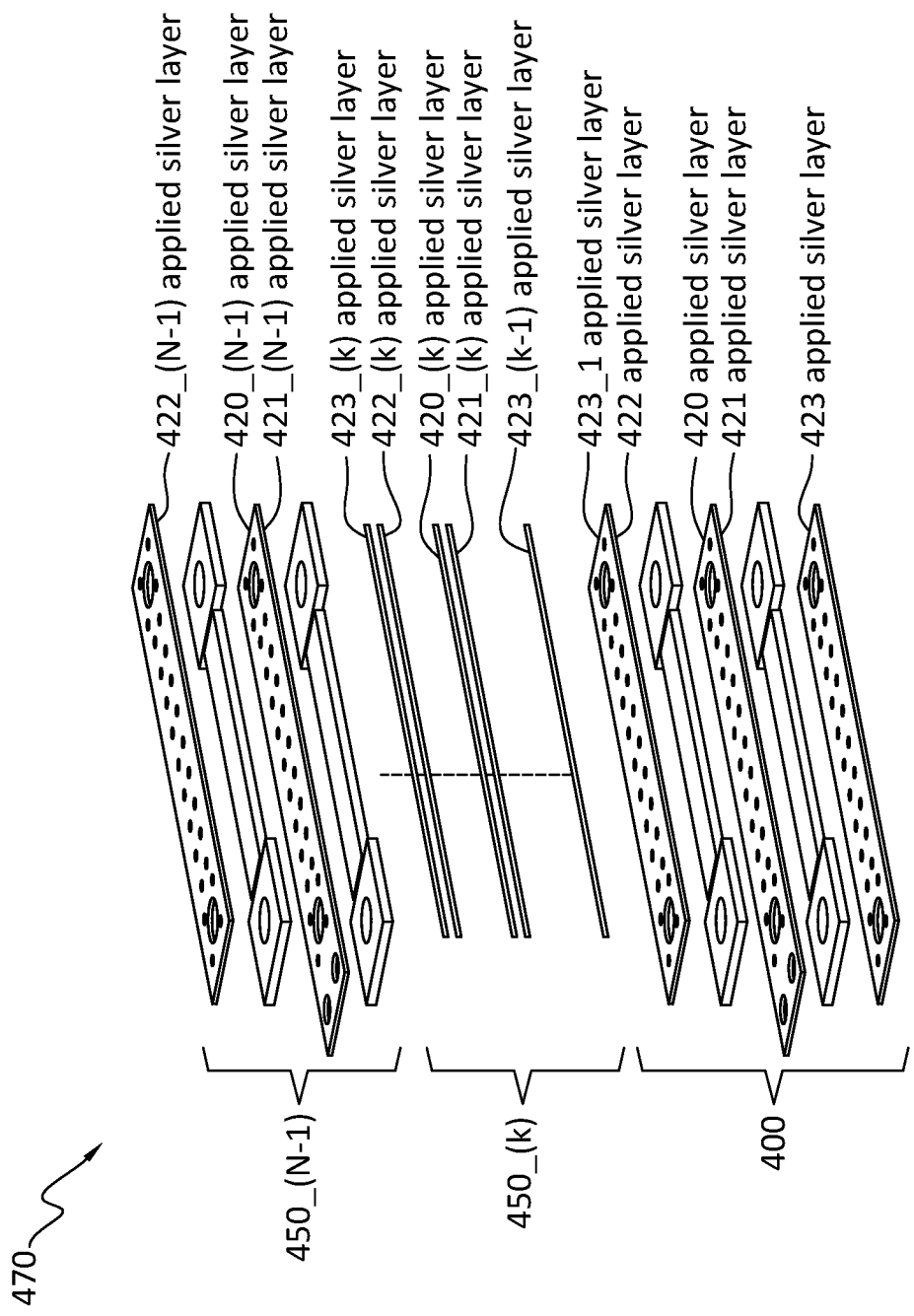
FIG. 6 shows an exploded view of a N-fold high deformation high temperature capable wire-free bimorph cantilever multilayer device in accordance with an embodiment of the invention.

Still referring to FIGS. 2A and 2B 6, with the laminates still carefully aligned to form a common planar piece with common end 417, one or more common negative polarity electrical connectors 406, such as a thru-bolt or screw arrangement, may be installed through each vertically aligned cut-out 409 to electrically connect perforated center plate 305 and negative electrical tab 415. Note that connectors 406 do not electrically connect to perforated top metal plate 301a or perforated bottom metal plate 301b. Importantly, connectors 406 play a dual role of both electrically connecting the perforated center plate 305 to the external electrical tab 415 while simultaneously mechanically affixing central metal layer 305, spacer 418, block 501, and metal tab 415.

Again, referring to FIGS. 2A and 2B, with the laminates still carefully aligned to form a common planar piece with common end 417, common connectors 428, such as a thru-bolt or screw arrangement, may be installed through tip mass acceptor hole 528. This arrangement mechanically affixes all layers of device 400 at their common end.

Figure 1B:
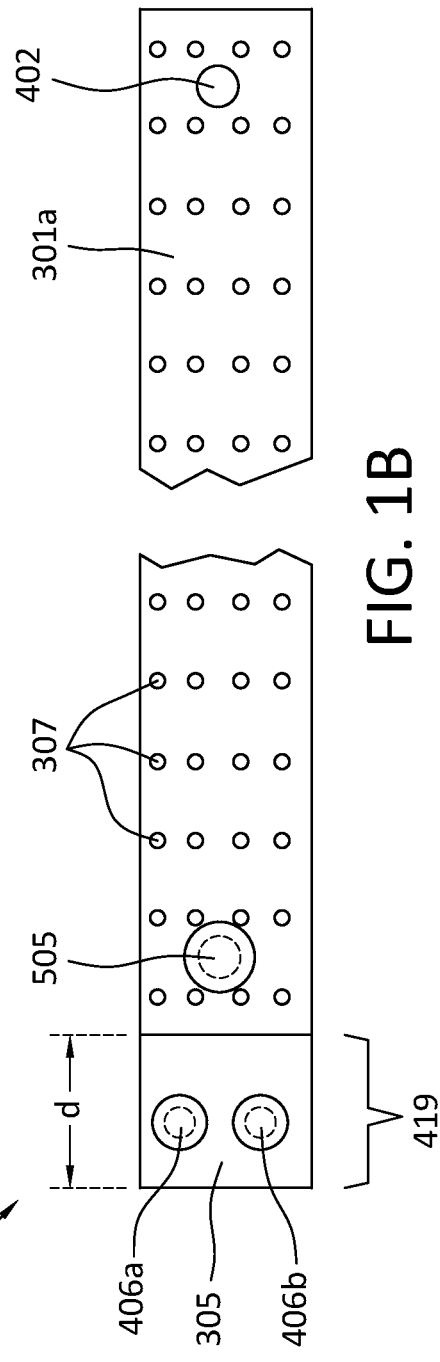
FIG. 1B shows a top view of the laminate layer assembly of FIG. 1A.

Referring to FIGS. 1A and 1B, a locking mechanism 408b may be attached to each thru-connector 406b at the underside of tab 415. A locking mechanism 506 may be attached to thru-connector 505 at the underside of tab 416. Referring to FIGS. 2A and 2B, a locking mechanism 426 may be attached to tip thru-connector 428 at the underside of 301b. Suitable locking mechanisms include standard threaded nuts and other similar known devices. By tightening all locking mechanisms in a uniform manner acts to induce an orthonormal compressive force across the laminate structure 400 which is may be adjusted through selective torqueing or tightening connectors 408b, 506, and 426.

Prior to subjecting the pre-constrained article 400 to a thermal profile, a static mass can optionally, as needed, be positioned on top of the laminate 400 as to apply a normal loading force on 400. Adding such a mass will further increase the constraining static pressure applied during the thermal cycle process.

Referring to FIGS. 3A-3C, subsequent to introducing desired static laminate pressure on the layers of device 400, either through the locking process of the thru-connectors or possibly adding additional static mass, in keeping with the invention, device 400 is subjected to a thermal profile 308 that causes suffusion metal layers 422, 420, 421 and 423 to cross-link with respective adjacent members namely, top metal plate 301a, bottom metal plate 301b, and center metal plate 305 and the transductive assembly layers 303a and 303b and to suffuse from state 307 and 314 to 310 and 311 into the perforations of top metal plate 301a, bottom metal plate 301b, and center metal plate 305. In accordance with an aspect of the invention, thermal profile 308 has a rise region, steady state region and a fall region. Thermal profile 308 may be determined by the selection of materials multilaminar device 400, the pre-loading of multilaminar device 400, and the overall dimensions of the layers that comprise multilaminar device 400. This thermal process acts to form an extremely strong mating between all the interlaminate layers of 400. In some embodiments, thermal profile 308 includes rise region whereby temperature increases at a rate of 3° C./min from room temperature to 500° C., holds for 30 minutes at 500° C., and decreases at a rate of 3° C./min to room temperature. Subsequent to applying the thermal profile 308, any excess conductive metallic suffusion material 310 should be removed as to present a flat surface 313 at the top and bottom metal plates 301a, and 301b. The exact same process applying to the mating of 305, 303b, and 301b.

For striction transductive materials such as piezoelectric and electrostrictive materials this bonding process can be further strengthened by pre-electroding the top and bottom surfaces of such transductive materials 306a and 306b with a thin conductive metallic layer prior to their installation into the laminate construction 400. Subsequent to application of thermal profile 308, bolt or screw arrangement 428 installed through the tip mass acceptor hole 528 may be removed to form an uninterrupted common laminate end 417 of multilaminar structure 400. Further, multilaminar device 400 may then be polarized, either magnetically or electrically, as to activate the transductive properties of transductive assembly layers 303a and 303b.

Figure 5:
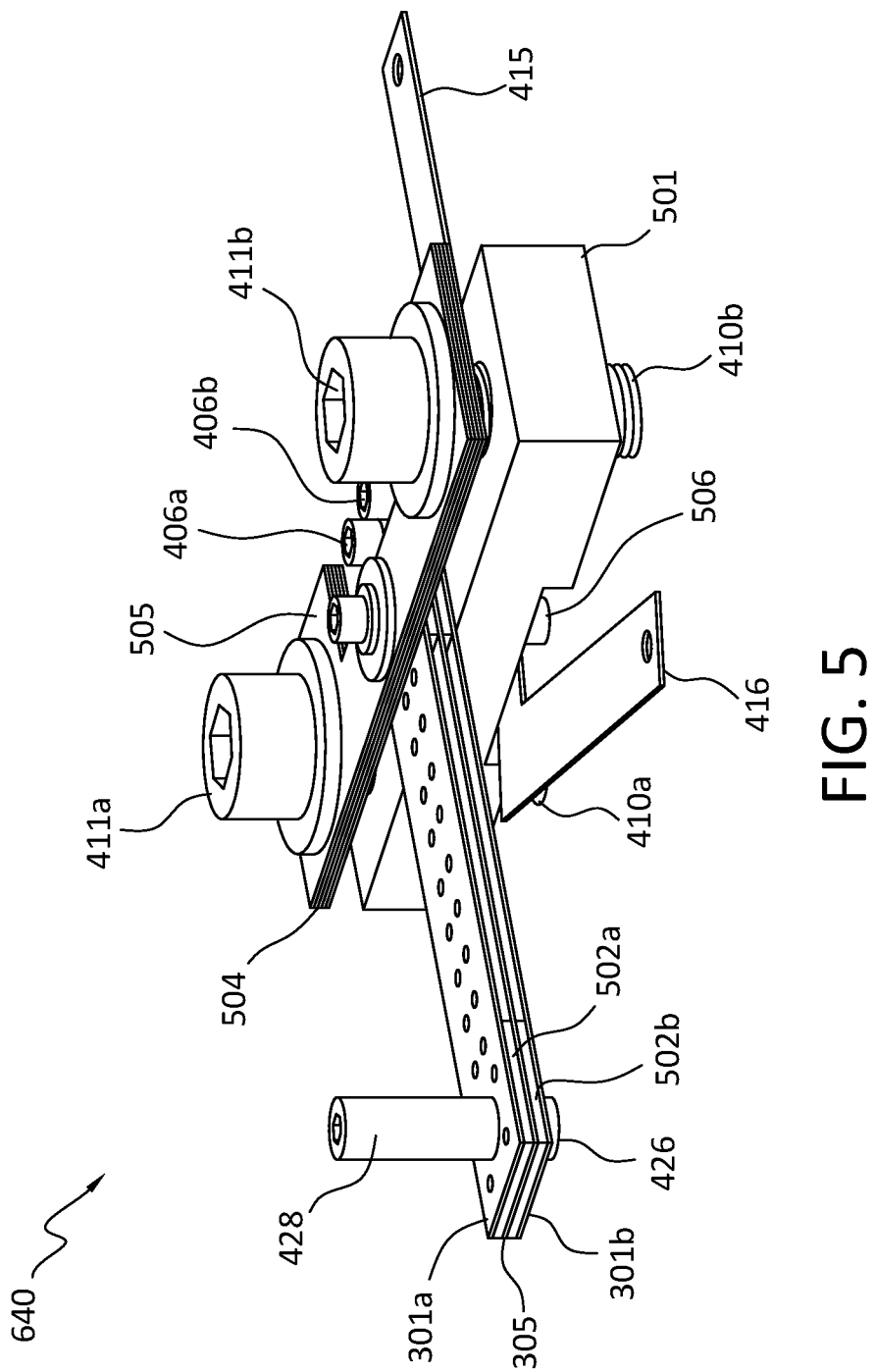
FIG. 5 depicts a perspective view of a laminate layer assembly having mechanical and electrical connectors according to an embodiment of the invention.

Referring to FIG. 5, in order to better operate over a target frequency band, a tip mass 428 may be incorporated into the tip acceptor hole 402. Adding a mass serves to lower the frequency band of operation of the multilaminar device 400 either as a sensor, energy harvester or as an actuator. Tip mass 428 is again attached by attaching mechanism 426 at the underside of metal layer 301b.

In some applications, especially those related to use of multilaminar device 400 as an energy harvesting mechanism, it may be advantageous to increase the stiffness of the joint between multilaminar device 400 and its applied substructure, here represented by block 501. Referring to FIG. 5, such a stiffening may be realized by introducing stiffening plates or shims 504 positioned above multilaminar device 400 and that lock multilaminar device 400 and block 501 by though connectors 411a and 411b that are transversally disposed in shim stiffener through connector cut-outs 410a and 410b, respectively. In some embodiments, each through connector may be provided with a corresponding locking mechanism at the underside of block 501.

As described hereinabove and depicted in FIGS. 1A and 1B, multilaminar device 400 comprises three perforated, stacked metal layers 301a, 305, and 301b that mechanically capture and electrically mate with transductive assembly layers 303a and 303b as described. In keeping with the invention, a multilaminar assembly may be formed by combining a plurality of multilaminar devices 400. FIG. 10 depicts such a device. The level 1 device 400 is depicted. The number of metal and transductive layers can be extended to a further set of 400 levels 400 (level 1) to 400 (level N) by adding additional thin metal coating such as silver 423(1) to top surface of perforated top metal plate 301a, then a first transductive assembly layer, and then a further silver layer on the top surface 421(1) of this added transductive assembly layer, a second center metal plate 305 atop this added silver layer 420(1), and then a further silver layer 422(1) on top of second center metal plate 305, then a second transductive layer atop silver layer 422(1), then a further silver layer on the top surface of the second transductive layer, then a second perforated top metal plate 301a; these added layers forming 450_(1) the first reduced copy of 400. Repeating this addition for 450_(1) to 450_(N−1) yields an N-level multilaminar assembly 470.

A wider band capable embodiment of multilaminar device 400 can be obtained by moving the positive and negative cut-outs and thru-connectors from the protrusion end of 400 to a selected position that is some length along the multilaminate construction of 400. Referring to device 680 of FIG. 7A-7D, the top and bottom perforated metal plates 701a and 701b incorporate identically placed tabs positioned at length h of multilaminar device 400 of length l, therefore dividing multilaminar device 400 into two sections, one having a length h and the other having a length l−h. In accordance with an aspect of the invention, h≠l/2. The ratio of h to (l−h) is important to defining the wider frequency response. As illustrated in FIG. 7B, the transductive layers now comprise of two sections; the first transductive assembly layer includes transductive sections 303c and 303d that are positioned between top spacers 702a and 702b and a non-conductive spacer 703a respectively. Similarly, a second transductive layer consists of sections 303e and 303f that are positioned between bottom spacers 702c and 702d and a non-conductive spacer 703b, respectively.

Referring to FIG. 7C, each such top and bottom perforated metal plate 701a and 701b incorporates tip access cut-outs at first and second ends configured to receive a tip mass 431a and 431b. First and second central plate tabs incorporate positive polarity cut-out holes 402a and 402b through which are inserted positive polarity thru-connectors 505a and 505b that mechanically affix perforated top metal plate 701a, non-conductive spacer 703a, perforated center plate 705, non-conductive spacer 703b, perforated bottom metal plate 701b, positive polarity tab 416 and locking arrangement 505 positioned underneath positive polarity tab 416. In some embodiments only one of through connectors 505a and 505b are mechanically engage with tab 416. In other embodiments both through connectors 505a and 505b engage with tab 416. Similarly, perforated center plate 705 incorporate a cut-out 409 as to enable negative polarity thru-connector 406 to be countersunk through cut-outs 409 in perforated top and bottom metal plates 701a and 701b as to mechanically and electrically affix perforated center plate 705 to negative polarity metal tab 415.

It will be obvious to those familiar with the bimorph devices that the dual bimorph embodiment so described can be readily be adapted to further embodiments having three (triangular positive and negative polarity connector arrangement at h) or more (circular positive and negative polarity connector arrangement at h) disposed sections. Each such section possibly including different transductive materials and differing tip masses.

Further, the embodiment depicted in FIGS. 7A-7D is a metal/ceramic structure that employs a central electrical mechanical arrangement positioned along its length yielding a 2-spoke design comprising of two unequal, and independent, cantilever beams exhibiting distinct frequency responses. The addition of unequal tip masses further separates these independent frequency bands from each other. The result is that this embodiment of the invention displays superior performance as a sensor or energy harvester over a single cantilever type device. The skilled artisan will recognize that the 2-spoke design may readily be transitioned to an N-spoke design for N>2 wherein the central electrical mechanical arrangement is in a geometry such as a circular design that is conducive to splaying N multiple unequal beam lengths with N unequal tip masses as to achieve an even wider effective coupling with mechanical or magnetic energy across the spectrum.

In keeping with the invention, transductive elements of the invention may be comprised of piezoceramic or electrostrictive materials and as such will provide for extremely radhard embodiments. For example, thin film and thick film piezoceramic materials have been tested under SEE, SEU, and X-ray. Although piezoelectric thin films can be susceptible to radiation-induced degradation over long durations, thick film ceramics of interest in this invention are far less susceptible from such effects. Indeed, it has been determined that thick film piezoceramics can operate over extended periods into years under continuous gamma radiation exposure. As a consequence, because the invention completely eliminates all wiring and adhesives, employing transductive elements in the invention as high temperature capable thick-film piezoceramics along with high temperature capable metal layers and thru-connectors provides embodiments of the invention that are both very radhard and can operate to very high temperatures. For example, by assembling the laminate of the present invention to consist of lithium niobate (LiNbO3), $YCa_4O(BO_3)_3$ (YCOB) or aluminum nitride (AlN) piezoelectric ceramic layers, results in devices of the present invention that can stably operate to 800° C. range. For perforated metal layers, suitable materials include Invar due to its remarkably low coefficient of thermal expansion (CTE). Nickel alloys may be suitable for applications for applications over 1000° C.

The laminar construction of the present invention is advantageous in that it enables a direct, low cost, route to simple laminar construction of sensors, actuators and energy harvesters that can reliably function to very high temperatures.

Depending upon the class of materials employed in the fabrication a single level or N-level constructed bimorph can effectively operate as a cantilever actuation mechanism, a sensor mechanism or an energy harvester mechanism each capable of high-power operation over high thermal ranges. As with conventional piezoelectric bimorphs, tip masses can be added as to adjust the resonant frequencies of said device. By arranging multiple bimorph mechanisms of the invention that are of differing lengths as to possess a common fixed termination point, the device can act as a broadband sensor or energy harvester that can provide high sensitivity or high-power generation in a very high temperature environment. In other embodiments, multilaminate structures according to the invention may have a disc geometry replacing the cantilever. Importantly, the resulting mechanisms of the invention eliminate the need for the usual electrode wiring that of itself can be of issue when operating at higher temperatures.

Although the present invention has been described in terms of particular preferred embodiments, it is not limited to those embodiments. Alternative embodiments, examples, and modifications which would still be encompassed by the invention may be made by those skilled in the art, particularly in light of the foregoing teachings. For example, a number of factors affect the performance of the present invention including geometry, number and type of metal layers, thickness ratio of active to inactive layers, tip mass (es), transductive material compositions, pre-stresses, and applied electrical lead characteristics. Further, the skilled artisan will recognize that the resulting wire free and adhesive free assembly can equally function as a sensor, actuator, or energy harvester depending upon how the electrical connections at the base of the mounting block are configured. With the positive polarity with respect to the negative polarity terminals configured as passive, the device acts as a sensor or energy harvester; when an AC potential is applied to the positive polarity terminals with respect to the negative polarity terminals the device acts in the function of an actuator.

VII INDUSTRIAL APPLICABILITY

The present invention may be employed in various systems and devices that require energy harvesters, actuators and/or sensors to operate in extreme conditions such as hypersonic vehicles, hypersonic weapons, re-entry vehicles, communication satellites, jet engines, industrial processes, space propulsion systems and other deep space devices. Further, the invention may be used in a variety of high temperature, high radiation sensor implementations including strain sensors, pressure sensors, gas sensors and accelerometers.

What is claimed is:

1. A wire-free, adhesive-free multilayer bimorph device comprising:
    a perforated outer top metal layer having a retainer clamping hole disposed in a first end section;
    a first suffusing conductive ink layer that interlocks with the perforations of said outer top metal layer
    a first transductive assembly including a transductive element having a retainer spacer disposed at a first end, the transductive assembly being suffused to the first suffusing conductive ink layer;
    a second suffusing conductive ink layer suffused to the first transductive assembly;
    a perforated central metal layer having a retainer clamping hole disposed in a first end section and at least one terminal hole disposed in the first end section, said second suffusing conductive ink layer being interlocked with the perforations of the central metal layer;
    a third suffusing conductive ink layer that interlocks with the perforations of said central metal layer
    a second transductive assembly including a transductive element having a retainer spacer disposed at a first end, the transductive assembly being suffused to the third suffusing conductive ink layer;
    a fourth suffusing conductive ink layer that suffused to the second transductive assembly; and
    a perforated outer bottom metal layer having a retainer clamping hole disposed in a first end section, said the fourth suffusing conductive ink layer being interlocked with the perforations of the outer metal layer, the first end of said outer top metal layer, said outer bottom metal layer, and said first and second transductive assemblies being aligned.

2. The device of claim 1 wherein the first and the second transductive assemblies include a spacer disposed at respective second ends, each spacer including a tip mass clamping hole, wherein each of said outer top metal layer, said outer bottom metal layer, and said central metal layer include a tip mass clamping hole disposed at respective second ends such that the tip mass clamping holes of the outer top metal layer, outer bottom metal layer, the central metal layer, and the first and second transductive assemblies are vertically aligned to forming a tip mass channel.

3. The device of claim 1 further comprising a through connector disposed through the tip mass channel.

4. The device of claim 1 further comprising a tip mass attached to said through connector.

5. The device of claim 1 further comprising a top rigid layer having a clamping hole disposed a first end and a second end on the upper side of the outer top metal layer and a bottom rigid layer having a clamping hole disposed a first end and a second end on the underside of the outer bottom metal layer and a thru-connectors that traverse the first and second clamping holes thereby applying a pre-stress on said device.

\* \* \* \* \*